United States Patent
Allman et al.

(10) Patent No.: US 6,211,096 B1
(45) Date of Patent: Apr. 3, 2001

(54) TUNABLE DIELECTRIC CONSTANT OXIDE AND METHOD OF MANUFACTURE

(75) Inventors: Derryl D. J. Allman, Colorado Springs, CO (US); Dim Lee Kwong, Austin, TX (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 08/823,305

(22) Filed: Mar. 21, 1997

(51) Int. Cl.[7] .......................... H01L 21/31; H01L 21/469
(52) U.S. Cl. .......................... 438/787; 438/783; 438/784; 257/310; 257/532
(58) Field of Search .................... 438/787, 788, 438/789, 790, 381, 396, 624, 778, 785, 957, 240, 783, 784; 257/758, 760, 306, 295, 296, 310, 532

(56) References Cited

U.S. PATENT DOCUMENTS

| | | | |
|---|---|---|---|
| 5,145,711 | 9/1992 | Yamazaki et al. | 427/38 |
| 5,198,263 | 3/1993 | Stafford et al. | 427/577 |
| 5,260,134 | 11/1993 | Hayashi et al. | 428/412 |
| 5,275,850 | 1/1994 | Kitoh et al. | 427/557 |
| 5,288,518 * | 2/1994 | Homma | 427/255 |
| 5,296,258 | 3/1994 | Tay et al. | 427/96 |
| 5,324,690 | 6/1994 | Gelatos et al. | 437/236 |
| 5,380,516 | 1/1995 | Tanabe et al. | 423/446 |
| 5,380,557 | 1/1995 | Spiro | 427/249 |
| 5,413,967 | 5/1995 | Matsuda et al. | 437/235 |
| 5,423,945 | 6/1995 | Marks et al. | 156/662.1 |
| 5,429,995 | 7/1995 | Nishiyama et al. | 437/238 |
| 5,618,761 * | 4/1997 | Eguchi et al. | 438/785 |

FOREIGN PATENT DOCUMENTS

| | | | |
|---|---|---|---|
| 62-035562 * | 2/1987 | (JP) | H01L/27/10 |
| 6077145 | 3/1994 | (JP) | H01L/21/205 |
| 8213386 | 8/1996 | (JP) | H01L/21/31 |

* cited by examiner

*Primary Examiner*—Charles Bowers
*Assistant Examiner*—Hsien-Ming Lee

(57) ABSTRACT

A method is shown for manufacturing a semiconductor device in which a silicon oxide film acts as an insulating film for electrically isolating conductive layers included in the semiconductor device. An oxynitride silicon-oxide-like film is formed containing fluorine, carbon and nitrogen and having a given dielectric constant by CVD method using a source gas which contains at least silicon, nitrogen, carbon, oxygen and fluorine contributors. By controlling the ratio of nitrogen to oxygen in the source gas as used in the CVD method, the ultimate nitrogen, carbon and fluorine concentrations in the film can be controlled and hence the dielectric constant of the film so produced.

3 Claims, 3 Drawing Sheets

TUNABLE DIELECTRIC CONSTANT OXIDE AND METHOD OF MANUFACTURE

BACKGROUND OF THE INVENTION

1. Technical Field

The present invention relates generally to a method of manufacturing semiconductor devices and, specifically, to a method of forming films such as silicon oxide films used in the manufacture of such devices, the films having a tunable dielectric constant.

2. Description of the Related Art

Chemical vapor deposition (CVD) is a commonly used technique for forming thin films and has been widely used as a manufacturing technique in the semiconductor device industry. CVD methods using an organic or inorganic silicon compound gas and an oxidizing gas are well known as methods for forming thin films of silicon oxide. In such semiconductor devices, an insulating film is typically utilized for electrically isolating element wiring. The typical insulating film used in the past was a $SiO_2$ film formed by the thermal oxidation of a silicon substrate or a $SiO_2$ film formed by chemical vapor deposition under a reduced pressure or atmospheric pressure using gaseous materials such as silane and tetraethoxy silicate (TEOS). Particularly in the case of aluminum wirings, $SiO_2$ films are preferred for insulation and are formed by CVD techniques using either TEOS or silane and $O_2$ because such $SiO_2$ films can be formed under temperatures as low as about 400° C.

As transistors are scaled into the submicron regions in such semiconductor devices, the interconnect spacing between wiring is reduced so that electromagnetic coupling of adjacent metal lines is possible causing errors, noise and, in the extreme case, a non-functioning device. As the space between two adjacent metal lines is shortened in accordance with the miniaturization of the semiconductor circuitry, increased capacitance occurs between the metal lines tending to obstruct the higher operating speed of the semiconductor device, thereby inhibiting the performance improvement offered by the miniaturization of the device.

As a result of these shortcomings, it is often important to decrease the dielectric constant of the insulating film which is interposed between two adjacent lines in a semiconductor device. The $SiO_2$ film formed by conventional plasma CVD methods typically has a dielectric constant in the range from about 4.0 to 5.0. The higher the dielectric constant of the oxide film, the further the electromagnetic field can penetrate into the dielectric media. By reducing the dielectric constant of the oxide, two interconnect lines can be placed closer in proximity, thus lowering the operating voltage of the transistor because the noise margin thereof can be reduced. It is desirable, therefore, in some instances to reduce the dielectric constant of such films from approximately 4.5 to about 3.0 or lower.

Contrarily, it is sometimes desirable to increase the dielectric constant of the oxide film being formed in semiconductor devices such as capacitors. The higher dielectric constant materials can be used to form regions of capacitance within the integrated circuit. The higher the dielectric constant of the material, the smaller the capacitance region required, resulting in a smaller capacitor, thereby equating to an area savings.

The dielectric constant of oxides can be lowered by the addition of carbon or fluorine into the oxide. While this general principle has been stated in the prior art, the previous attempts to provide a film having a lowered dielectric constant have exhibited various deficiencies. For example, in Japanese Patent Application No. 2-77127, fluorine is introduced into $SiO_2$ by means of ion implantation. However, it is necessary to apply a heat treatment at a temperature of at least about 600° C. within the $SiO_2$ layer. Thus, the $SiO_2$ layer formed by this method cannot be used for isolation of aluminum wirings within semiconductor devices.

In U.S. Pat. No. 5,429,995, issued Jul. 4, 1995 and assigned to Kabushiki Kaisha Toshiba, a method is shown for manufacturing a semiconductor device with a film which exhibits a low dielectric constant which uses FSi $(OC_2H_5)_3$ as the silicon source gas. A particular object of the invention was to provide an insulating film having low hygroscopicity. It would be desirable, however, to use as the organic silicon source gas a conventional TEOS to allow conformal coverage and to provide a process which can be run on any of the conventional PECVD type deposition systems.

Additionally, in certain of the prior art techniques, it has been difficult to control accurately the fluorine concentration in the $SiO_2$ film.

Accordingly, it is an object of the present invention to provide a method for forming a $SiO_2$ film which has a tunable dielectric constant and which is formed by conventional plasma CVD methods using TEOS as the silicon source gas or which is formed by either HDP (high density plasma) or atmospheric pressure chemical vapor deposition (APCVD) methods using a silane as the source gas.

Another object of the invention is to provide a method for manufacturing a semiconductor device in which a silicon oxide film containing fluorine and carbon is produced, the film acting as an insulating film for electrically isolating conductive layers included in the semiconductor device, the film being formed by plasma CVD technique using an organic silicon gas as a starting material.

Another object of the invention is to provide basic nitrogen incorporation to act as a moisture and OH barrier for the activating film.

Another object of the invention is to provide a lower dielectric constant film which is stable with higher concentrations of fluorine incorporated into the film.

Another object of the invention is to provide a method of manufacturing semiconductor devices in which the conductive layers on the silicon oxide films so produced have improved reliability.

SUMMARY OF THE INVENTION

A method for manufacturing a semiconductor device is shown in which a silicon oxide film acts as an insulating film for electrically isolating conductive layers included in the semiconductor device. A silicon oxide film is formed containing fluorine and having a given dielectric constant by CVD method using a source gas containing at least silicon, nitrogen, carbon, oxygen and fluorine contributors. The ratio of nitrogen to oxygen in the source gases used in the CVD method is controlled in order to control the ultimate carbon and fluorine concentrations and hence the dielectric constant of the silicon oxide film so produced. The addition of nitrogen to the film also acts as a barrier to the diffusion of $H_2O$ or OH into the film in subsequent processing steps. Preferably, the source gases, in addition to a silicon contributor include $N_2O$, $O_2$ and $C_2F_6$. The given dielectric constant and moisture barrier properties of the silicon oxide film are determined by controlling the relative ratios of $N_2O:O_2:C_2F_6$ and high frequency to low frequency power applied, with silane $SH_x$ or $NH_x$ as the source gases in the CVD method.

The silicon source can be a conventional TEOS. $N_2O$ can be used as the nitrogen contributor in the source gas to add nitrogen to the silicon oxide film which is formed in order to improve reliability of the film when used in a semiconductor device.

A method is also shown for manufacturing a semiconductor device in which a silicon oxide film is formed with regions having a relatively high dielectric constant, the regions of relatively high dielectric constant being used to form capacitors within the semiconductor device. In this aspect of the invention, a silicon oxide film can be formed containing fluorine and having a given dielectric constant value by plasma CVD method using a source gas containing at least silicon, nitrogen, carbon, oxygen and fluorine contributors introduced within a reaction chamber. A high dielectric compound can also be introduced into the reaction chamber to form the relatively high dielectric constant silicon oxide film. The high dielectric compound is preferably selected from the group consisting of either a single source or mixtures of alkoxy compounds of the general formula MOR, or titanate compounds of the general formula $MTiO_3$ and $M_2TiO_5$, where M is an alkali or alkaline earth metal, or ferroelectric materials. The high dielectric compound can be added to the reaction chamber by liquid or vapor injection into the CVD reaction chamber. The high dielectric compounds added to the reaction chamber typically have dielectric constants between 15 and 12,000.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
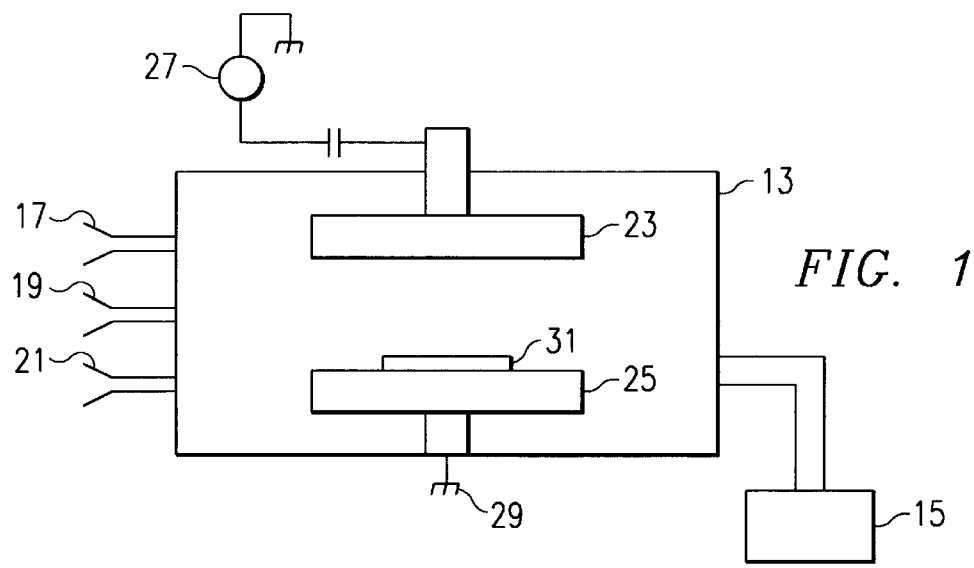
FIG. 1 is a simplified, schematic view of a plasma CVD chamber of the type used in the method of the present invention.

FIG. 1 shows a parallel plate type plasma CVD apparatus of the type which can be used in practicing the method of the invention. A gas within the chamber interior 13 is discharged to the exterior thereof by means of a suitable pump 15. Appropriately selected source gases are introduced into the chamber interior 13 by means of a plurality of quartz nozzles 17, 19, 21. A set of parallel plate electrodes 23, 25 are mounted within the chamber interior 13. A variable frequency power source 27 is connected to the top electrode 23 with the bottom electrode 25 being connected to a ground potential point 29. A Si substrate 31 is mounted on the lower electrode 25.

The dielectric constant of the oxide films produced according to the present method can be "tuned" by the selective addition of carbon, nitrogen or fluorine or all of the aforementioned to the oxide film. The process of the invention allows the deposition of a conformal TEOS film which has been doped using carbon, nitrogen and fluorine. The process controls the percentage of carbon and fluorine that is added to the film in order to selectively "tune" the resulting dielectric constant of the film. The film doped only with carbon, fluorine and nitrogen has shown improved transistor reliability performance over standard oxide films. One advantage of the present method is that the starting gases can employ TEOS as the silicon source, thereby allowing conformal step coverage. The process can be run using any plasma enhanced chemical vapor deposition (PECVD) deposition system, such as the radio frequency plasma assisted CVD system shown in FIG. 1. Atmospheric or high density plasma systems may also be used to apply this film.

The process of the invention preferably utilizes tetraethoxy silicate (TEOS) as the silicon source, although other silicon sources could be utilized besides TEOS. Other silicon sources include, for example, $HSi(N(CH_2)_2)_3$; $Si(N(CH_3)_2)_4$; $(CH_3)_3SiN_3$; and $SiH_4$ or mixtures thereof.

The preferred oxidizing source gases are $N_2O$ and $O_2$ although other sources of oxidizing gas could be utilized, as well, including NO, $NH_3$, $O_2$, or a combination of these gases.

A preferred fluorine source gas is $C_2F_6$. Other fluorine source gases which could be used include $SiF_4$, $CF_4$ and mixtures thereof, or any other fluorine gaseous source conveniently available.

By using $N_2O$ alone or as one of the oxidizing source gases, TEOS is not fully oxidized, leaving carbon behind in the film being produced. By reacting $N_2O$ and $O_2$ within selected percentages with TEOS, different percentages of carbon can be left behind in the film. The percentage of fluorine and carbon added to the film is controlled by the flow rate (partial pressure) of the $C_2F_6$ gas source introduced to the process. The use of $N_2O$ as the oxidizing gas source also leaves behind nitrogen in the film being produced. Using the techniques of the invention, it is possible to reduce the dielectric constant of the silicon film being produced from around 4.5 to about 3.5, or lower. The addition of nitrogen to the film changes the doped silicon dioxide film to a doped oxynitride film. The oxynitride film provides a barrier to water and hydroxyl diffusion, thus allowing a more stable, lower dielectric constant film to be formed. Higher concentrations of fluorine can be added to the oxynitride film above that of a standard fluorine doped silicon dioxide film to produce a final film with a lower dielectric constant.

Figure 2:
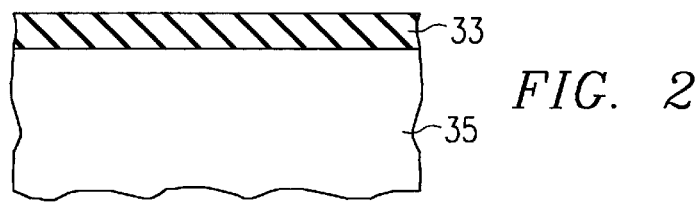
FIGS. 2–4 are simplified, cross-sectional views showing the steps employed in manufacturing a semiconductor device of the invention.
Figure 3:
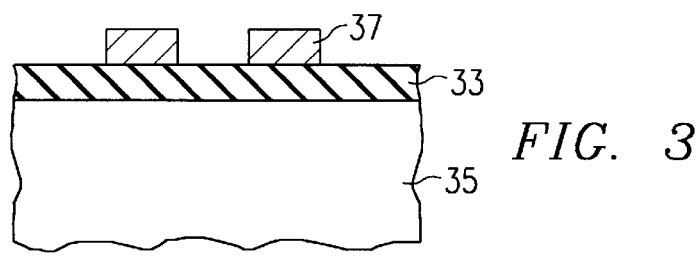
Figure 4:
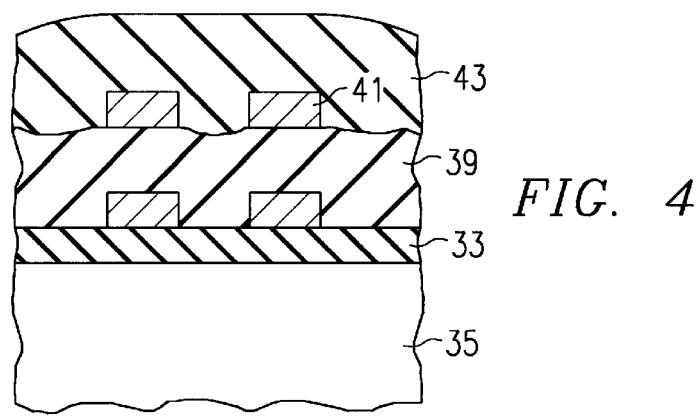

FIGS. 2–4 illustrate, in simplified fashion, the steps of the method of the invention. A silicon oxide film containing fluorine, carbon and nitrogen having a given dielectric constant is formed by CVD method using a source gas containing at least silicon, nitrogen, oxygen, carbon and fluorine contributors. With reference to FIG. 1, the Si substrate 31 is mounted on the electrode 25, followed by heating the substrate 31 to between 300° C.–500° C. with a resistance heater. Under these conditions, a tetraethoxy silicate (TEOS) gas, $N_2O$ as an oxidizing source gas and $C_2F_6$ as a fluorine source gas are simultaneously introduced into the chamber interior 13 at flow rates in the range of 4 to 10 L/min for $C_2F_6$, 5 to 12 L/min for $N_2O$, 0.8 to 3 L/min for TEOS and 0.01 to 5 L/min for $O_2$, respectively so as to set up a pressure of 10 microTorr to 1 atmosphere within the chamber. Particularly preferred gas flow rates are 6 L/min for $C_2F_6$, 10 L/min for $N_2O$, 2.8 L/min for TEOS and 0.05

L/min for $O_2$ at a low relative pressure of about 2.6 Torr within the chamber interior 13. The ratio of $N_2O$ to $O_2$ in the source gases can be in the range of 1:1 to 1200:1 with a preferable setting of 200:1. Also, the total RF power supplied to the electrode 23 can be in the range of 0.1 to 2.5 KWatt with a preferred setting of 0.5 KWatts in order to cause a discharge and, thus, to form a doped oxynitride, $SiO_2$ like, film 33 (FIG. 2) on the Si substrate 35. The ratio of the low frequency power, at 300 KHz, to high frequency power at 13.56 MHz was in the range of 6:1 to 1:1 with a preferable setting of 1.5:1.

In succeeding step, an aluminum film is formed by any convenient means, for example by physical vapor deposition followed by patterning the aluminum film to form a first aluminum wiring 37 (see FIG. 3). Next, a $SiO_2$ film 39 is formed in the same manner that the film 33 was formed. Additionally, an aluminum film is formed to cover the second $SiO_2$ film 39 followed by patterning the aluminum film to form a second aluminum wiring 41, as in the formation of the first aluminum wiring 37. Finally, a $SiO_2$ film 43 is formed to cover the second aluminum wiring 41. Conventional gap fill processes, such as SOG fill, can be used to locally planarize the space between adjacent metal lines. The use of the SOG local gap fill process will require the deposition of two doped oxynitride films to encapsulate the SOG film.

Figure 5:
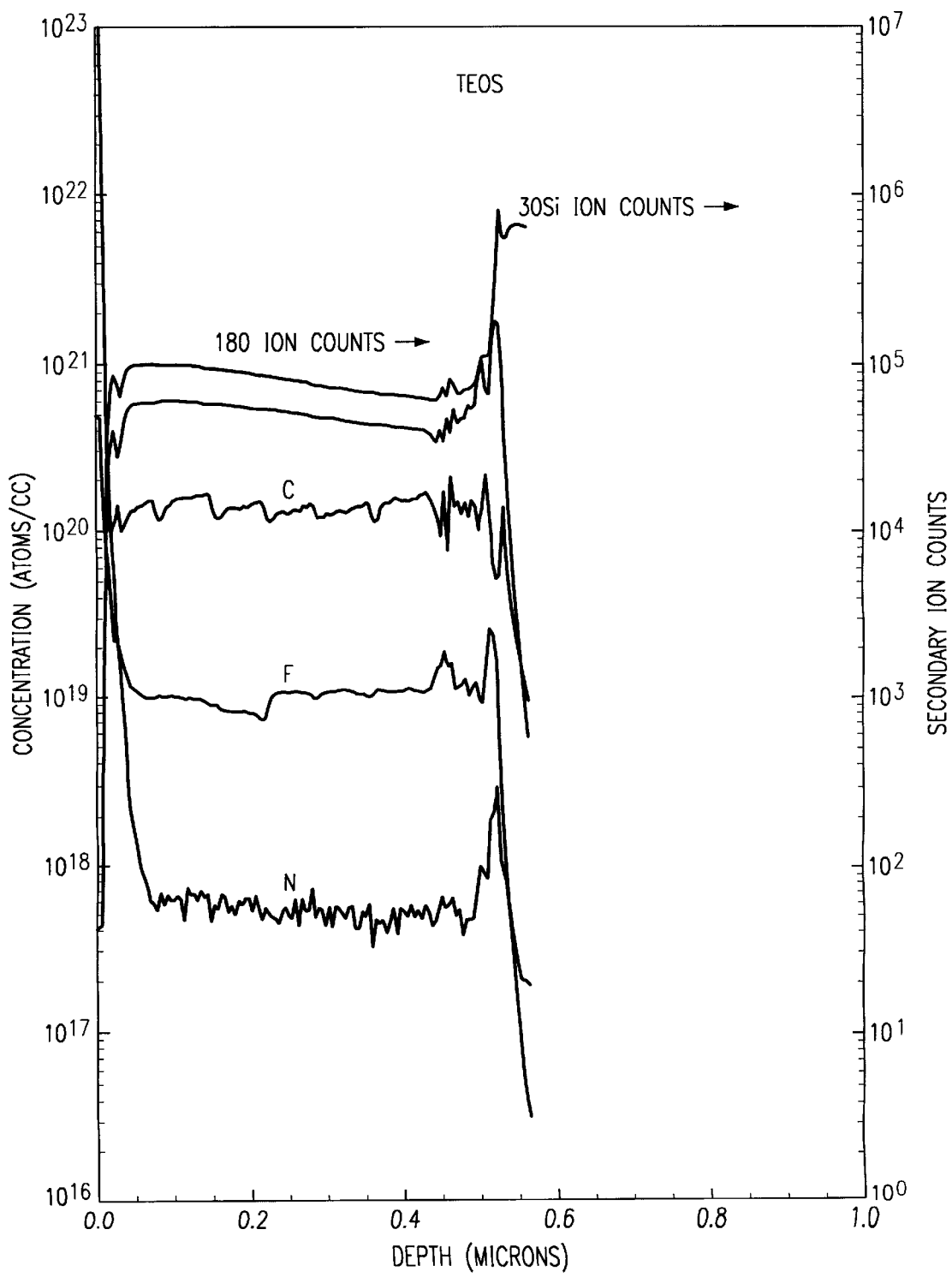
FIGS. 5–6 are graphs of the carbon, fluorine and nitrogen concentrations of $SiO_2$ films formed by conventional methods and formed with the tunable dielectric constants of the invention, respectively.
Figure 6:
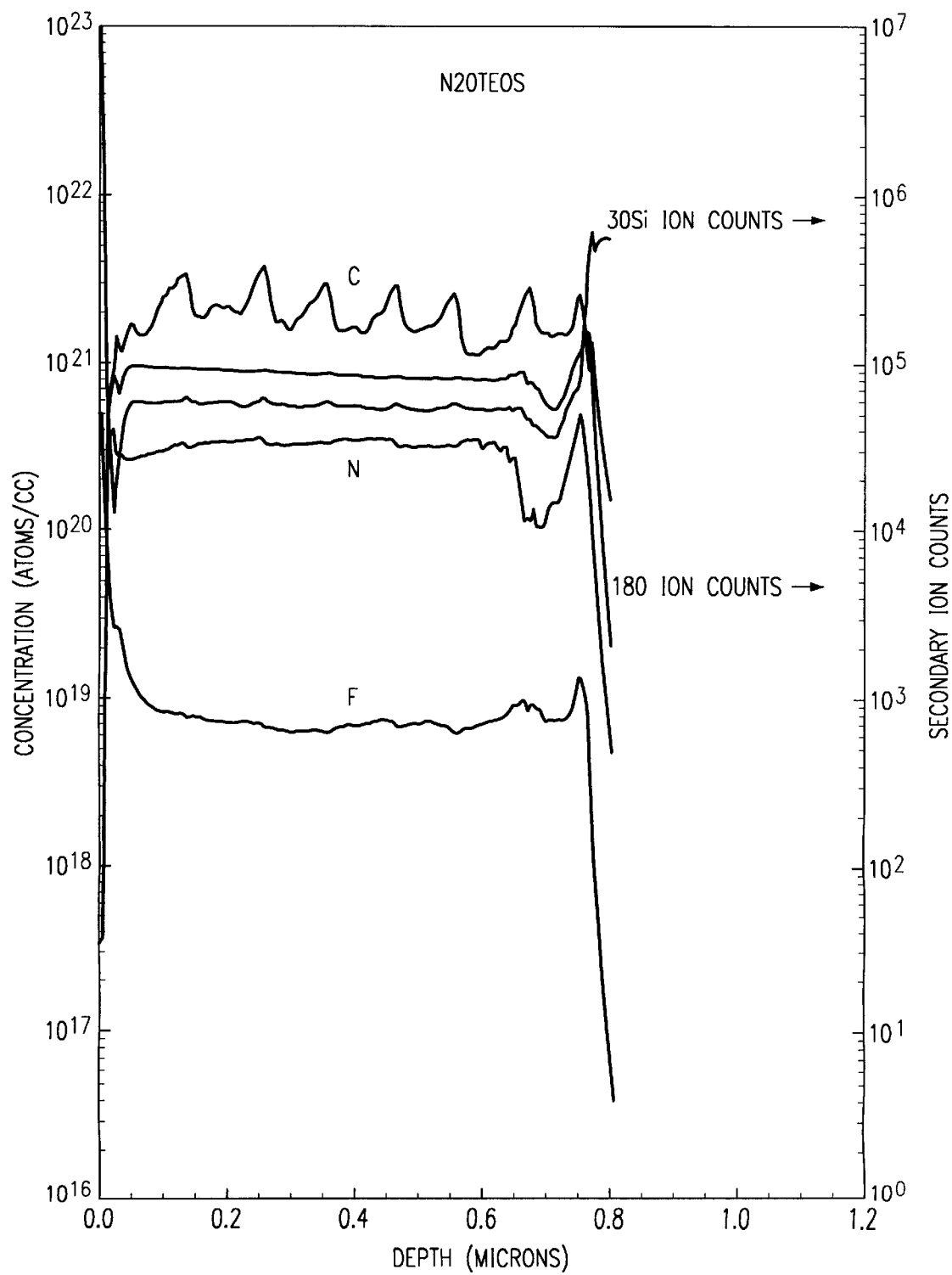

Thus, in the method of the invention, a semiconductor device can be manufactured in which a silicon oxide film acts as an insulating film for electrically isolating conductive layers included in the semiconductor device. The silicon oxide film is formed containing fluorine, carbon and nitrogen and having a given dielectric constant value by the CVD method using a source gas which contains at least silicon, nitrogen, carbon, oxygen and fluorine contributors. By controlling the ratio of nitrogen to oxygen in the source gases used in the CVD method, the ultimate carbon and fluorine concentrations and hence the dielectric constant of the silicon oxide film can be controlled. FIGS. 5 and 6 are graphical representations of the carbon, fluorine and nitrogen concentrations versus the depth in microns of the films formed using TEOS and a conventional source gas mixture and formed using the controlled source gas mixture of the invention, respectively.

Preferably, the given dielectric constant is determined by controlling the relative ratios of $N_2O:O_2:C_2F_6$ and TEOS as the source gases in the CVD method.

The method of the invention also allows silicon oxide films to be produced which have increased dielectric constants to thereby provide a "tunable" dielectric constant oxide. In this aspect of the invention, a semiconductor device is manufactured in which a silicon oxide film is formed with regions having a relatively high dielectric constant. The regions of relatively high dielectric constant are used to form capacitors within the semiconductor device. A silicon oxide film is formed containing metal oxides and having a given dielectric constant value by CVD method using a source gas which contains at least silicon, nitrogen and oxygen contributors which are introduced within a reaction chamber. A high dielectric compound is also introduced into the reaction chamber which is preferably selected from the group consisting of either single source or mixtures of alkoxy compounds of the general formula MOR and/or titanate compounds of the general formula $MTiO_3$ and $M_2TiO_5$, where M is a alkali or alkaline earth metal, and/or ferroelectric materials to form a relatively high dielectric constant silicon oxide film. The high dielectric compound can be added to the reaction chamber by liquid or vapor injection into the CVD reaction chamber. The high dielectric compounds added to the reaction chamber have a dielectric constant between about 15 and 12,000.

Alkoxy (MOR) or titanate ($MTiO_3$ or $M_2TiO_5$) compounds (where M is an alkali or alkaline earth metal, Ba, Sr, Ca, Mg) or ferroelectric compounds can be used in PECVD or CVD operations to form high dielectric constant oxide or ceramic films. Titanates in the pure form have dielectric constants between 15 to 12,000. The addition of these compounds to an oxynitride or silicon dioxide film will effectively form a composite film with an increased dielectric constant. The final film can be homogeneous, graded or layered.

Some typical sources for the high dielectric constant compound are:

Barium:
    Barium hexafluoropentane-Dionate
    Barium Isopropoxide
    Barium Isopropoxide
    Barium II Methoxypropoxide
    Barium 2,4-Pentanedionate
    Barium II 2,2,6,6-Tetramethyl-3,5-Heptanedionate
    Barium II 2,2,6,6-Tetramethyl-3,5-heptanedionate Calcium:
    Calcium ethoxide
    Calcium Hexafluoropentanedionate
    Calcium Methoxide
    Calcium Methoxyethoxide
    Calcium 2,4-Pentanedionate
    Calcium 2,2,6,6-Tetramethyl-3,5-Heptanedionate Magnesium:
    Magnesium Ethoxide
    Magnesium Hexafluoropentanedionate
    Magnesium Methoxide
    Magnesium Methoxypropoxide
    Magnesium Methyl Carbonate
    Magnesium 2,4-Pentanedionate
    Magnesium n-Propoxide
    Magnesium trifluopentanedionate Strontium:
    Strontium Hexafluoropentanedionate
    Strontium Isopropoxide
    Strontium Methoxypropoxide
    Strontium 2,4-Pentanedionate
    Strontium 2,2,6,6-Tetramethyl-3,5-Heptanedionate Titanium:
    Poly(Dibutyltitanate)
    Diethoxysiloxane-Ethyltitanate
    Poly (Octylenegylcoltitanate)

Heterometallic or Double Metal Alkoxides:
    Barium Titanium, $BaTi(OR)x$
    Magnesium Titanium, $MgTi(OR)x$
    Strontium Titanium, $SrTi(OR)x$ Oxoalkoxides have been formed by thermal condensation of heteralkoxides, alkoxide, titanate or organic salts. The addition of these compounds either by liquid or vapor injection into a CVD or PECVD reactor would produce the desired increase in the dielectric constant of deposited film.

In the second embodiment of the invention, in which the dielectric constant of the resultant film is increased, an Si substrate is again mounted to an electrode, such as electrode 25 in FIG. 1, followed by heating the substrate 31 to between 100° C.–900° C., where 500° C. is the highest temperature possible for aluminum capacitor electrodes. Under these conditions, a tetraethoxy silicate (TEOS) gas, $N_2O$ and $O_2$ as the oxidizing source gas, and titanium isopropoxide are simultaneously introduced into the chamber interior 13 at flow rates in the range of 0.8 to 2 L/min for TEOS, 0.01 to 12 L/min for $N_2O$, 0.01 to 12 L/min for $O_2$, and 0.01 to 10 L/min for titanium isopropoxide, receptively, so as to set up a pressure of 10 microTorr to 1 atmosphere within the chamber. The preferable gas flow rates 0.8 L/min for TEOS, 2 L/min for $N_2O$, 6 L/min for $O_2$, and 0.5 L/min for titanium isopropoxide, at a low relative pressure of about 1.8 Torr within the chamber interior 13. The ratio of $N_2O$ to $O_2$ in the source gases can be in the range of 0.000008:1 to 1200:1 with a preferable setting of 0.3:1. Also, the total RF power supplied to the electrode 23 can be in the range of 0.1 to 2.5 KWatt with a preferred setting of 0.8 KWatts in order to cause a discharge and, thus, to form a high dielectric constant oxide film 33 (FIG. 2) on the Si substrate 35. The ratio of the low frequency power, at 300 KHz, to high frequency power at 13.56 MHz was in the range of 6:1 to 0.1:1 with a preferable setting of 1:1.

An invention has been shown with several advantages. The method of the invention provides a convenient means for tuning the dielectric constant of an oxide film of the type used in the manufacture of semiconductor devices. The dielectric constant of the oxide film can be lowered by doping the film with carbon or fluorine atoms. By lowering the dielectric constant of the oxide film below about 4.0, cross talk between adjacent conductive lines can be minimized. The method of the invention can employ a conventional TEOS as the silicon source gas which allows conformal step coverage. Also, the process can be run on any conventional CVD deposition system.

By reducing the dielectric constant of the oxide film, two interconnect lines can be spaced in closer proximity, thereby lowering the operating voltage of the circuit. The use of a PECVD environment is advantageous because of the relatively low temperatures required for metal interconnect lines. A convenient carbon and fluorine source gas is $C_2F_6$. Using this gas, it is possible to reduce the dielectric constant of the silicon oxide film from approximately 4.5 to about 3.5 or lower according to the teaching of the invention. By adding an appropriate high dielectric constant compound to the reaction chamber, the dielectric constant of the silicon oxide film can be raised to form capacitors within the semiconductor devices.

While the invention has been shown in only two of its forms, it is not thus limited but is susceptible to various changes and modifications without departing from the spirit thereof.

What is claimed is:

1. A method for manufacturing a semiconductor device in which a silicon oxide film is formed with first regions having a higher dielectric constant than second regions, the first regions being used to form capacitors within the semiconductor device, the method comprising the steps of:

forming a silicon oxide film containing a metal oxide and having a given dielectric constant by plasma chemical vapor deposition method using a source gas containing at least silicon, nitrogen and oxygen contributors introduced within a reaction chamber; and further introducing to the reaction chamber a high dielectric compound selected from a group consisting of alkoxy compounds of a first general formula MOR and titanate compounds of a second general formula MTiO3 and M2TiO5, where M is an alkali or alkaline earth metal, and ferroelectric compounds, to form a relatively high dielectric constant silicon oxide film.

2. The method of claim 1, wherein the high dielectric compound added to the reaction chamber is added by liquid or vapor injection to the chemical vapor deposition reaction chamber.

3. The method of claim 2, wherein the high dielectric compounds added to the reaction chamber have dielectric constants between 15 and 12,000.

* * * * *